(12) United States Patent
Takata (10) Patent No.: US 12,542,537 B2
(45) Date of Patent: Feb. 3, 2026

(54) FILTER DEVICE AND MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 143 days.

(21) Appl. No.: 18/641,973

(22) Filed: Apr. 22, 2024

(65) Prior Publication Data

US 2024/0275362 A1  Aug. 15, 2024

Related U.S. Application Data

(63) Continuation of application No. PCT/JP2022/041034, filed on Nov. 2, 2022.

(30) Foreign Application Priority Data

Nov. 4, 2021 (JP) ................................ 2021-180462

(51) Int. Cl.
H03H 9/64 (2006.01)
(52) U.S. Cl.
CPC ........ *H03H 9/6483* (2013.01); *H03H 9/6476* (2013.01)
(58) Field of Classification Search
CPC ................... H03H 9/6483; H03H 9/6476
See application file for complete search history.

(56) References Cited

U.S. PATENT DOCUMENTS

| 2010/0207707 A1* | 8/2010 | Yata ..................... H03H 9/6483 333/195 |
| 2018/0115300 A1 | 4/2018 | Kaneko et al. |
| 2022/0123717 A1 | 4/2022 | Takeuchi |
| 2022/0149818 A1* | 5/2022 | Takeuchi ........... H03H 9/14552 |

FOREIGN PATENT DOCUMENTS

| JP | H0661783 A | 3/1994 |
| JP | 2018067874 A | 4/2018 |
| JP | 2020053876 A | 4/2020 |
| WO | 2021002321 A1 | 1/2021 |
| WO | 2021015187 A1 | 1/2021 |

OTHER PUBLICATIONS

International Search Report in PCT/JP2022/041034, mailed Jan. 24, 2023, 3 pages.
Written Opinion in PCT/JP2022/041034, mailed Jan. 24, 2023, 3 pages.

* cited by examiner

*Primary Examiner* — Samuel S Outten
(74) *Attorney, Agent, or Firm* — Keating & Bennett, LLP (57) ABSTRACT

A filter device includes at least one parallel arm resonator and series arm resonators including at least one first series arm resonator and at least one second series arm resonator being different from each other, a resonant frequency of the first series arm resonator is higher than a pass band of the filter device, the second series arm resonator has a series connection configuration in which at least two series arm resonators are connected in series to each other, anti-resonant frequencies of the at least two series arm resonators are different from each other, and the resonant frequency of the first series arm resonator is between the anti-resonant frequency of the series arm resonator on a lowest frequency side of the second series arm resonator and the anti-resonant frequency of the series arm resonator on a highest frequency side of the second series arm resonator.

18 Claims, 7 Drawing Sheets

FILTER DEVICE AND MULTIPLEXER

CROSS REFERENCE TO RELATED APPLICATIONS

This application claims the benefit of priority to Japanese Patent Application No. 2021-180462 filed on Nov. 4, 2021 and is a Continuation Application of PCT Application No. PCT/JP2022/041034 filed on Nov. 2, 2022. The entire contents of each application are hereby incorporated herein by reference.

BACKGROUND OF THE INVENTION

1. Field of the Invention

The present invention relates to filter devices each including a plurality of series arm resonators and at least one parallel arm resonator.

2. Description of the Related Art

A filter device including a plurality of series arm resonators and at least one parallel arm resonator, which are made up of acoustic wave resonators, is known in the art. For example, a surface acoustic wave filter described in Japanese Unexamined Patent Application Publication No. 6-61783 includes three series arm resonators and four parallel arm resonators. Of the four parallel arm resonators, two parallel arm resonators each have a resonant frequency and an anti-resonant frequency that are both outside a pass band of the surface acoustic wave filter.

SUMMARY OF THE INVENTION

In the surface acoustic wave filter described in the Japanese Unexamined Patent Application Publication No. 6-61783, when both the resonant frequency and the anti-resonant frequency of the series arm resonator are positioned outside the pass band, attenuation characteristics near the anti-resonant frequency can be improved. However, this reduces the attenuation near the resonant frequency of this series arm resonator and leads to a problem of degrading attenuation characteristics.

Example embodiments of the present invention provide filter devices each capable of reducing or preventing degradation of attenuation near a resonant frequency of a resonator, which exists outside a pass band of the filter device.

A filter device according to an example embodiment of the present invention includes a plurality of series arm resonators, and at least one parallel arm resonator, in which the plurality of series arm resonators includes at least one first series arm resonator and at least one second series arm resonator, the at least one second series arm resonator being different from the at least one first series arm resonator, a resonant frequency of the at least one first series arm resonator is higher than a pass band of the filter device, the at least one second series arm resonator has a series connection configuration in which at least two series arm resonators are connected in series to one another, anti-resonant frequencies of the at least two series arm resonators are different from one another, and the resonant frequency of the at least one first series arm resonator is between an anti-resonant frequency of the series arm resonator on a lowest frequency side of the second series arm resonator and an anti-resonant frequency of the series arm resonator on a highest frequency side of the second series arm resonator.

According to example embodiments of the present invention, it becomes possible to provide filter devices each capable of reducing or preventing degradation of attenuation near a resonant frequency of a resonator, which exists outside a pass band of the filter device.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

In the following section, the present invention is disclosed in detail by describing specific example embodiments of the present invention with reference to the drawings.

It is worthwhile to point out that each example embodiment described in the present specification is for illustrative purposes only, and elements, structural configurations, features, characteristics, etc., of different example embodiments may be partially exchanged or combined.

Figure 1:
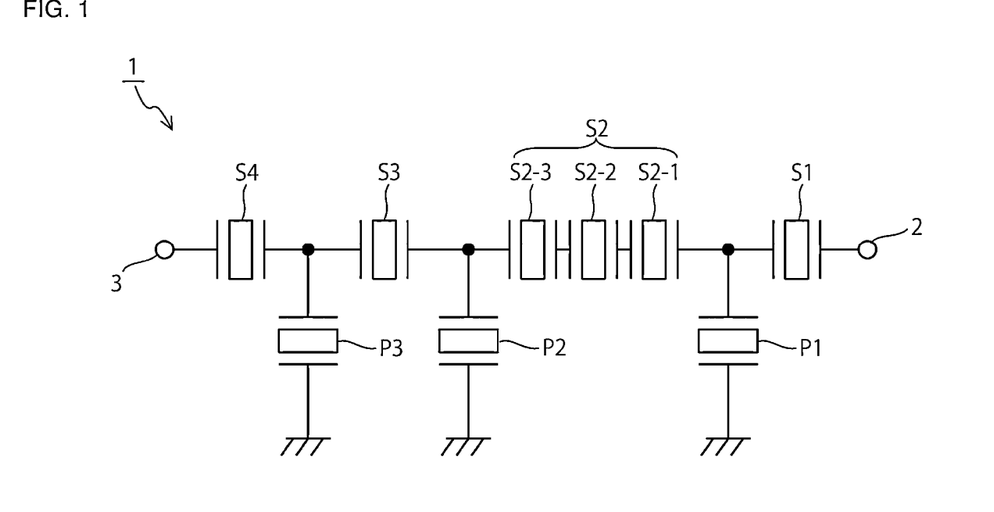
FIG. 1 is a circuit diagram of a filter device according to a first example embodiment of the present invention.

FIG. 1 is a circuit diagram of a filter device according to a first example embodiment of the present invention. A filter device 1 is a transmission filter of Band 1, for example. A pass band of the transmission filter of Band 1 is about 1920 MHz to about 1980 MHz, for example. Further, a pass band of a reception filter of Band 1 is about 2110 MHz to about 2170 MHz, for example.

The filter device 1 includes a transmission terminal 2 and an antenna terminal 3 to be connected to an antenna. In between the transmission terminal 2 and the antenna terminal 3, series arm resonators S1, S2, S3, and S4 are connected in series to each other. Parallel arm resonators P1, P2, and P3 are each connected to the series arm configured as described above. The parallel arm resonator P1 is connected between a ground potential and a connecting point of the series arm resonator S1 and the series arm resonator S2. The parallel arm resonator P2 is connected between the ground potential and a connecting point of the series arm resonator S2 and the series arm resonator S3. The parallel arm resonator P3 is connected between the ground potential and a connecting point of the series arm resonator S3 and the series arm resonator S4. Accordingly, the filter device 1 is a ladder filter having the foregoing configuration. Note that the series arm resonator S2 has a series connection configuration in which three series arm resonators S2-1, S2-2, and S2-3 are connected in series to each other. The series arm resonator S2 is a second series arm resonator according to an example embodiment of the present invention, and the series arm resonator S1 is a first series arm resonator according to an example embodiment of the present invention.

Figure 3:
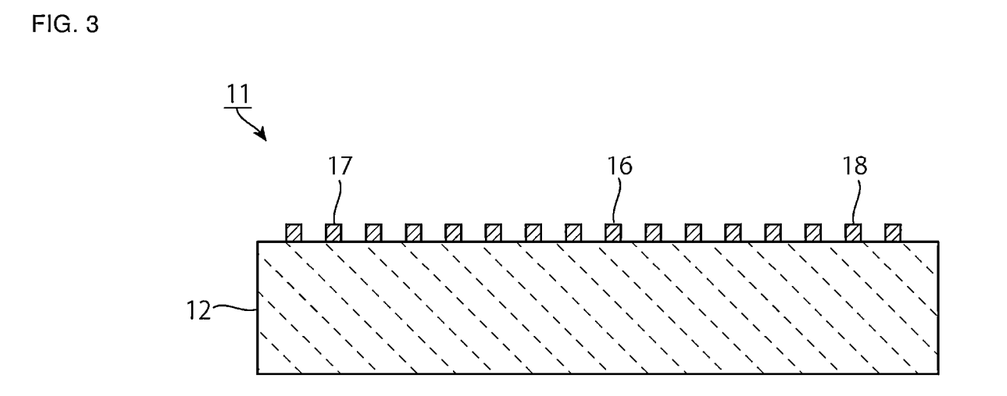
FIG. 3 is a front cross-sectional view illustrating a structure of an acoustic wave resonator being used in the filter device according to the first example embodiment of the present invention.

The foregoing series arm resonators S1, S2-1, S2-2, S2-3, S3, and S4 and the parallel arm resonators P1 to P3 each include an acoustic wave resonator. The structure of such an acoustic wave resonator is illustrated in FIG. 3 using a front cross-sectional view. Further, FIG. 4 is a schematic plan view illustrating an electrode structure of this acoustic wave resonator.

As illustrated in FIG. 3, an acoustic wave resonator 11 includes a piezoelectric substrate 12. On the piezoelectric substrate 12, an interdigital transducer electrode 16 and reflectors 17 and 18 are provided. The acoustic wave resonator 11 that uses the piezoelectric substrate 12 made of Y-cut $LiNbO_3$ is a surface acoustic wave resonator that uses leaky waves. The piezoelectric substrate 12 includes, for example, piezoelectric single crystal such as $LiNbO_3$, $LiTaO_3$, or the like.

Figure 4:
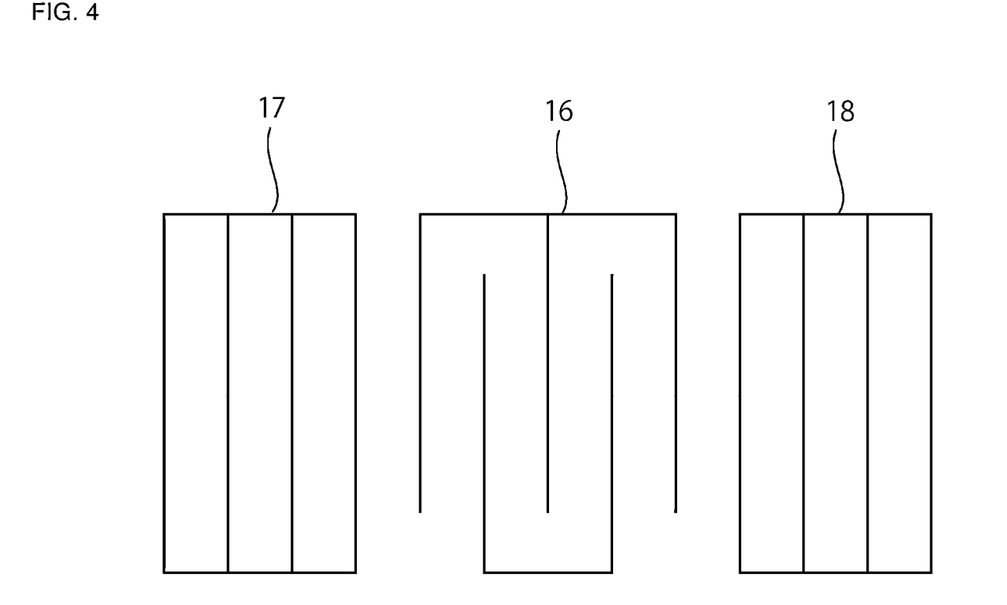
FIG. 4 is a schematic plan view illustrating an electrode structure of the acoustic wave resonator illustrated in FIG. 3.

As illustrated in FIG. 4, the reflectors 17 and 18 are provided on two sides of the interdigital transducer electrode 16. With this electrode structure, a one-port type surface acoustic wave resonator is configured.

The interdigital transducer electrode 16 and the reflectors 17 and 18 include an appropriate metal. Such a metal is not limited to any particular one. For example, Al, Cu, Mo, W, Pt, NiCr, or Ti, or the like can be used. Further, an alloy of these metals may alternatively be used. Furthermore, a multilayer body including a plurality of metal layers may alternatively be used.

Figure 2:
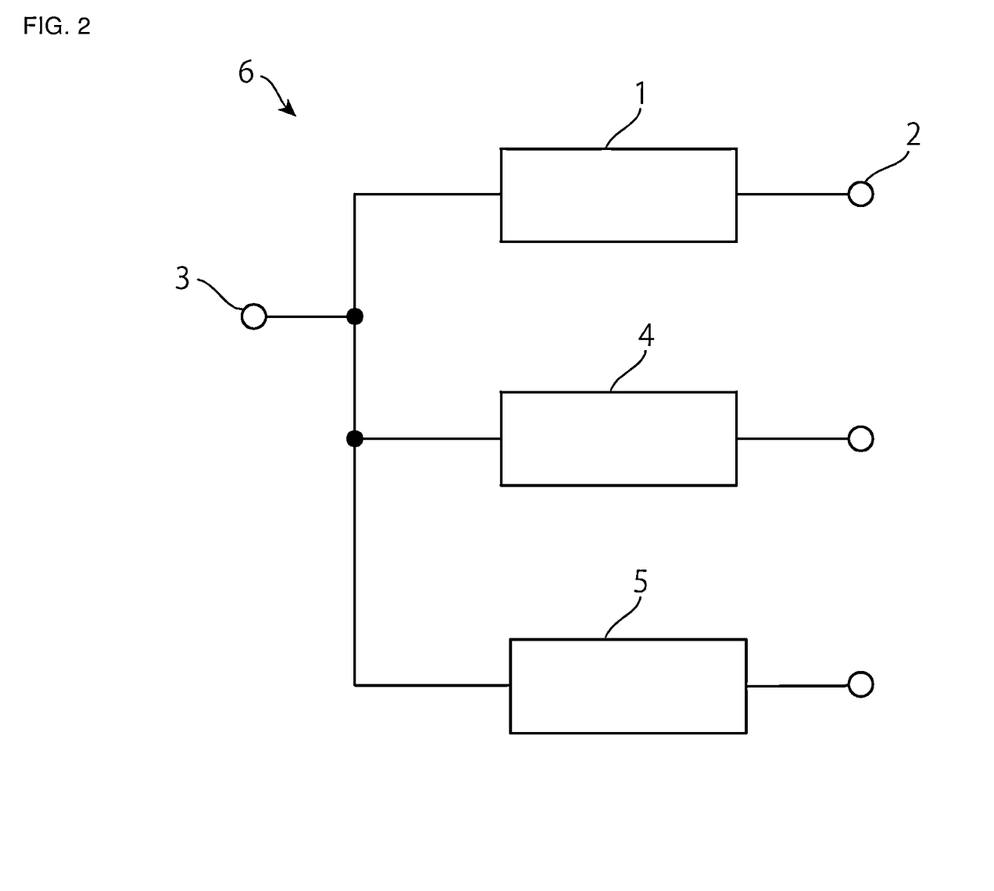
FIG. 2 is a circuit diagram of a multiplexer including the filter device according to the first example embodiment of the present invention.

Note that FIG. 2 is a circuit diagram of a multiplexer 6 including the filter device 1. The multiplexer 6 includes, in addition to the filter device 1, other filter devices 4 and 5. One end portion of the filter device 1, one end portion of the filter device 4, and one end portion of the filter device 5 define a common connection to the antenna terminal 3. The filter device 1 is used not only for a multiplexer but may also be used for a duplexer. The filter devices 4 and 5 may be a filter of Rx band (Band 1 Rx) and a filter of Band 34, which will be described below.

Returning to FIG. 1, the second series arm resonator S2 includes the series arm resonators S2-1, S2-2, and S2-3 described above. These series arm resonators S2-1, S2-2, and S2-3 correspond to a structure where the series arm resonator S2 is serially divided into three parts. The structure of the series arm resonators S2-1, S2-2, and S2-3 described above is defined as the series connection configuration. Note that in the present example embodiment, three series arm resonators S2-1, S2-2, and S2-3 are used. However, the number of the series arm resonators in the foregoing series connection configuration is not limited to three, and only needs to be at least two. Further, the foregoing series connection configuration is a configuration in which series arm resonators are connected in series to each other without having a branching point to a parallel arm resonator therebetween.

Further, the number of the first series arm resonators S1 described above is not limited to a particular number, and only at least one first series arm resonator needs to be included.

One of the unique features of the filter device 1 is that the second series arm resonator S2 has the foregoing series connection configuration and that anti-resonant frequencies of at least two of the series arm resonators S2-1, S2-2, and S2-3 are different. In addition, the resonant frequency of the first series arm resonator S1 is between the anti-resonant frequency of the series arm resonator on the lowest frequency side of the second series arm resonator S2 and the anti-resonant frequency of the series arm resonator on the highest frequency side of the second series arm resonator S2. Because of this, in the outside of the pass band of the filter device 1, it becomes possible to obtain sufficient attenuation in both the Rx band, that is, the pass band of the reception filter of Band 1, and the pass band of Band 34, and this enables the improvement of the attenuation characteristics. This will be disclosed in detail by describing a specific working example. Note that the pass band of Band 34 is about 2010 MHz to about 2025 MHz and is positioned in the vicinity of a high frequency side end portion of the pass band of the filter device 1, for example.

The following table 1 describes the parameters of the series arm resonators S1, S2-1, S2-2, S2-3, S3, and S4 of a filter device of a working example.

TABLE 1

| Working Example | S1 | S2-1 | S2-2 | S2-3 | S3 | S4 |
|---|---|---|---|---|---|---|
| Resonant frequency | 2060 MHz | 1948 MHz | 1966 MHz | 1998 MHz | 1946 MHz | 1980 MHz |
| Anti-resonant frequency | 2138 MHz | 2020 MHz | 2040 MHz | 2074 MHz | 2010 MHz | 2052 MHz |
| Resonant frequency after combining | — | 1970 MHz | | | — | — |
| Anti-resonant frequency after combining | — | 2020 MHz | 2040 MHz | 2074 MHz | — | — |
| Number for interdigital transducer | 180 | 460 | 350 | 350 | 398 | 147 |
| Number for reflector | 7 | 20 | 20 | 20 | 20 | 20 |
| Intersecting width | 14 μm | 32 μm | 24 μm | 23 μm | 31 μm | 21 μm |

The number for interdigital transducer is the number of electrode fingers in an interdigital transducer electrode.

Further, the number for reflector is the number of electrode fingers in a reflector. The intersecting width is an intersecting width in the interdigital transducer electrode. Note that the intersecting width is a value normalized by a wavelength λ. The wavelength λ is a wavelength determined by the electrode finger pitch.

For the purpose of comparison, the following filter devices of a comparative example 1 and a comparative example 2 are prepared. For series arm resonators S1, S2-1, S2-2, S2-3, S3, and S4 of the comparative example 1, the parameters described in the following table 2 are used.

TABLE 2

| Comparative Example 1 | S1 | S2-1 | S2-2 | S2-3 | S3 | S4 |
| --- | --- | --- | --- | --- | --- | --- |
| Resonant frequency | 1990 MHz | 1990 MHz | 1990 MHz | 1990 MHz | 1946 MHz | 1980 MHz |
| Anti-resonant frequency | 2064 MHz | 2064 MHz | 2064 MHz | 2064 MHz | 2010 MHz | 2052 MHz |
| Resonant frequency after combining | — | 1990 MHz | | | — | — |
| Anti-resonant frequency after combining | — | 2064 MHz | | | — | — |
| Number for interdigital transducer | 160 | 420 | 420 | 420 | 398 | 147 |
| Number for reflector | 7 | 20 | 20 | 20 | 20 | 20 |
| Intersecting width | 14 μm | 24 μm | 24 μm | 24 μm | 31 μm | 21 μm |

Further, for series arm resonators S1, S2-1, S2-2, S2-3, S3, and S4 of the comparative example 2, the parameters described in the following table 3 are used.

TABLE 3

| Comparative Example 2 | S1 | S2-1 | S2-2 | S2-3 | S3 | S4 |
| --- | --- | --- | --- | --- | --- | --- |
| Resonant frequency | 2060 MHz | 1990 MHz | 1990 MHz | 1990 MHz | 1946 MHz | 1980 MHz |
| Anti-resonant frequency | 2138 MHz | 2064 MHz | 2064 MHz | 2064 MHz | 2010 MHz | 2052 MHz |
| Resonant frequency after combining | — | 1990 MHz | | | — | — |
| Anti-resonant frequency after combining | — | 2064 MHz | | | — | — |
| Number for interdigital transducer | 180 | 420 | 420 | 420 | 398 | 147 |
| Number for reflector | 7 | 20 | 20 | 20 | 20 | 20 |
| Intersecting width | 14 μm | 24 μm | 24 μm | 24 μm | 31 μm | 21 μm |

Note that the tables 1 to 3 also describe the values of the resonant frequency and the anti-resonant frequency after combining, which are obtained when the series arm resonators S2-1, S2-2, and S2-3 are seen collectively as a single series arm resonator S2. Note in the following section, in some cases, the resonant frequency and the anti-resonant frequency after combining are described simply as the resonant frequency and the anti-resonant frequency of the series arm resonator S2.

The series arm resonators S2-1, S2-2, and S2-3 of the comparative example 1 and the comparative example 2 are all series arm resonators having the same parameters. The comparative example 2 is different from the working example only in this point.

The parameters of the parallel arm resonators P1 to P3 are described in the following table 4.

TABLE 4

| | P1 | P2 | P3 |
| --- | --- | --- | --- |
| Resonant frequency | 1890 MHz | 1897 MHz | 1896 MHz |
| Anti-resonant frequency | 1955 MHz | 1964 MHz | 1963 MHz |
| Number for interdigital transducer | 251 | 231 | 267 |
| Number for reflector | 25 | 25 | 25 |
| Intersecting width | 32 μm | 31 μm | 30 μm |

The parameters of the parallel arm resonators P1 to P3 of the comparative example 1 and the comparative example 2 are the same as those used in the working example.

The filter devices of the comparative example 1 and the comparative example 2 each have the circuit configuration illustrated in FIG. 1.

In the comparative example 1 and the comparative example 2, the series arm resonators S2-1, S2-2, and S2-3 have the same parameters, and thus the resonant frequency and the anti-resonant frequency after combining are equal to the resonant frequency and the anti-resonant frequency of each series arm resonator, respectively.

In the comparative example 1, the electrode finger pitch of the series arm resonator S1 is different from the one used in the comparative example 2, and the anti-resonant frequency of the series arm resonator S1 exists at a position separated from the Rx band, that is, 2110 MHz to 2170 MHz, which is the reception band of Band 1.

Figure 5:
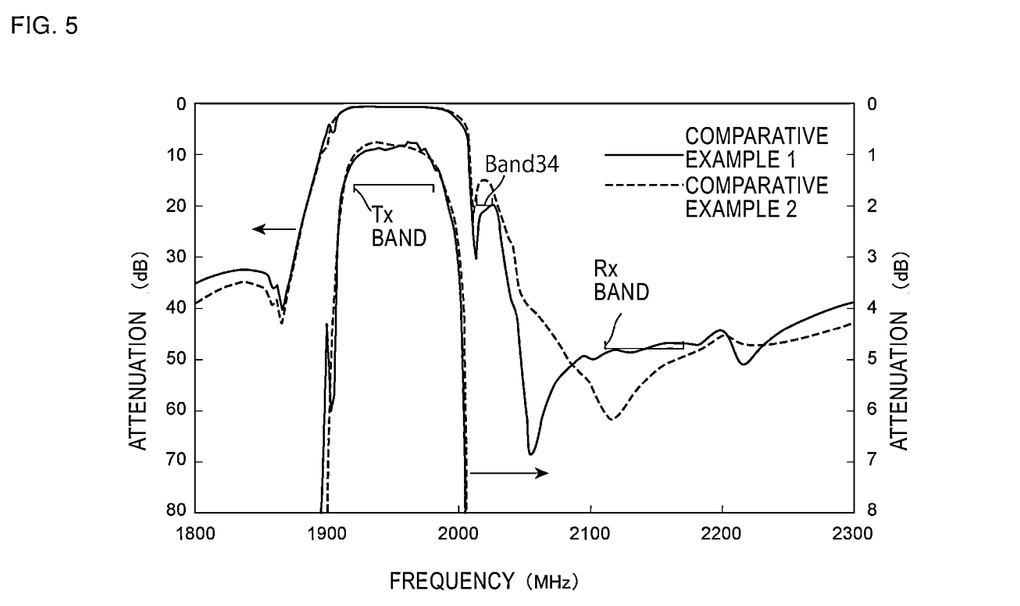
FIG. 5 is a diagram illustrating filter characteristics of filter devices of a comparative example 1 and a comparative example 2.
Figure 6:
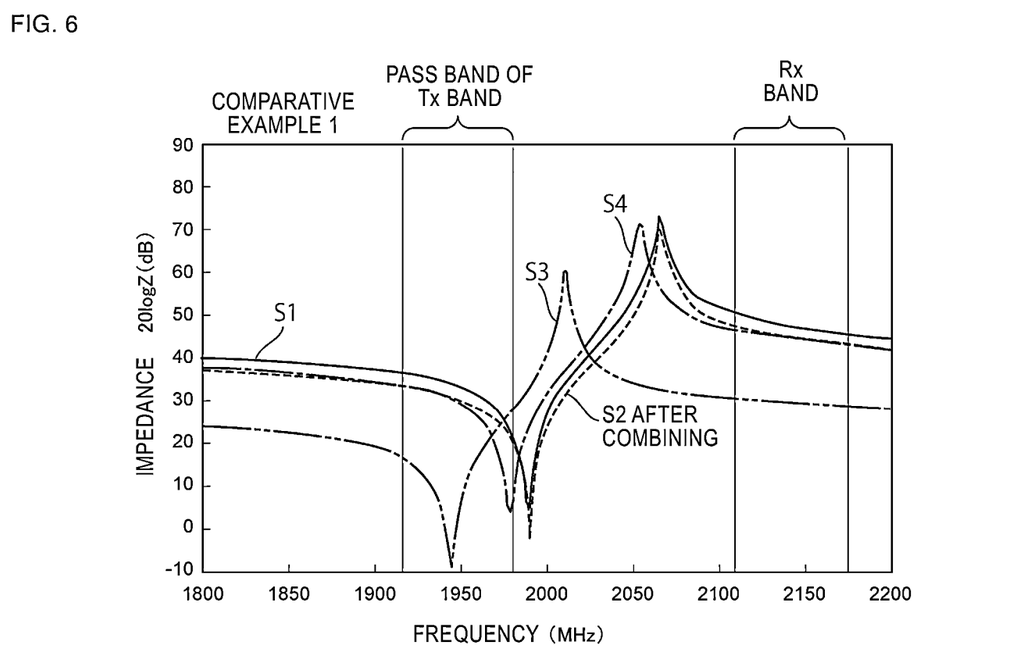
FIG. 6 is a diagram illustrating impedance characteristics of a plurality of series arm resonators of the comparative example 1.
Figure 7:
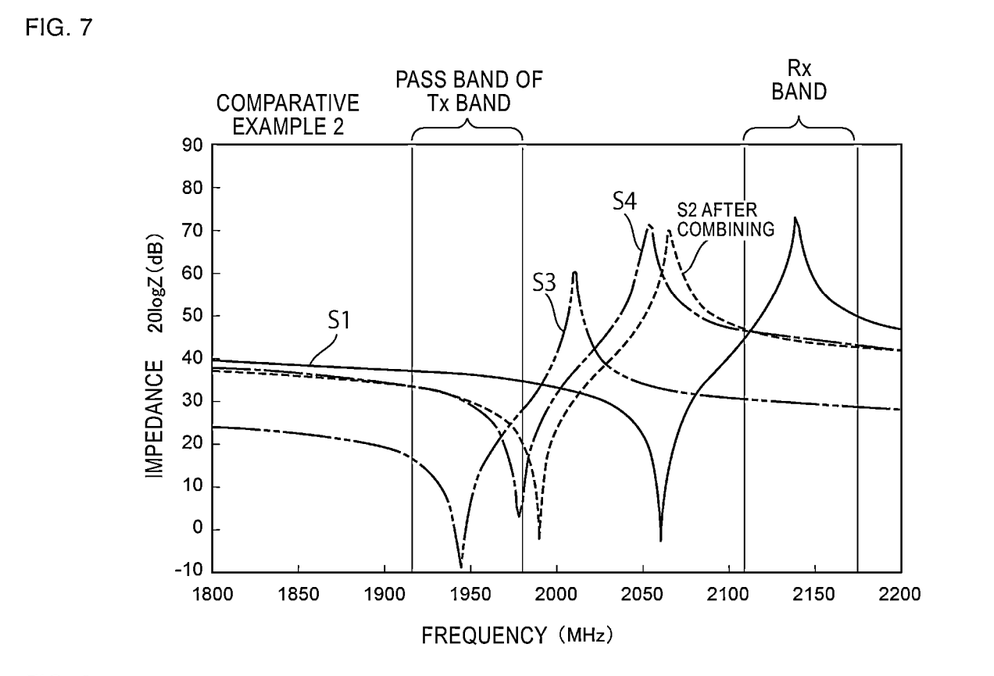
FIG. 7 is a diagram illustrating impedance characteristics of a plurality of series arm resonators of the comparative example 2.

FIG. 5 is a diagram illustrating filter characteristics of the filter devices of the comparative example 1 and the comparative example 2. FIG. 6 is a diagram illustrating the impedance characteristics of the series arm resonators S1, S3, and S4 and the impedance characteristic of the series arm resonator S2 formed by combining the series arm resonators S2-1, S2-2, and S2-3 of the comparative example 1. FIG. 7 diagram is a illustrating the impedance characteristics of the series arm resonators S1, S3, and S4 and the impedance characteristic of the series arm resonator S2 including a combination of the series arm resonators S2-1, S2-2, and S2-3 of the comparative example 2.

In the comparative example 2, the anti-resonant frequency of the series arm resonator S1 is 2138 MHz and is positioned inside the reception band of Band 1. Accordingly, the attenuation in the reception band is preferable in the comparative example 2 than in the comparative example 1. More specifically, while the attenuation is 47.1 dB in the comparative example 1, the attenuation is 49.5 dB, which is greater, in the comparative example 2.

On the other hand, compared with the comparative example 1, in the comparative example 2, the attenuation degrades in the range from a pass band's high frequency side to near about 2060 MHz where the resonant frequency of the series arm resonator S1 is positioned. Because of this, compared with the comparative example 1, the attenuation degrades in the pass band of Band 34 (about 2010 MHz to about 2025 MHz, for example), which exists near the pass band's high frequency side of the filter device 1. More specifically, while the attenuation is 20 dB in the comparative example 1, the attenuation is 15 dB, which is smaller, in the comparative example 2. This is because the anti-resonant frequency of the series arm resonator S1 shifts toward the higher frequency side to improve the attenuation of the reception band. Because of this, the attenuation pole that existed near about 2060 MHz before the shifting shifts toward a higher frequency side, and this degrades the attenuation in the pass band of Band 34. That is to say, in the configurations of the comparative examples 1 and 2, a trade-off relationship exists between the attenuation in the reception band and the attenuation in the pass band of Band 34. Accordingly, the improvement in one leads to the degradation of the other, which causes a problem.

Figure 8:
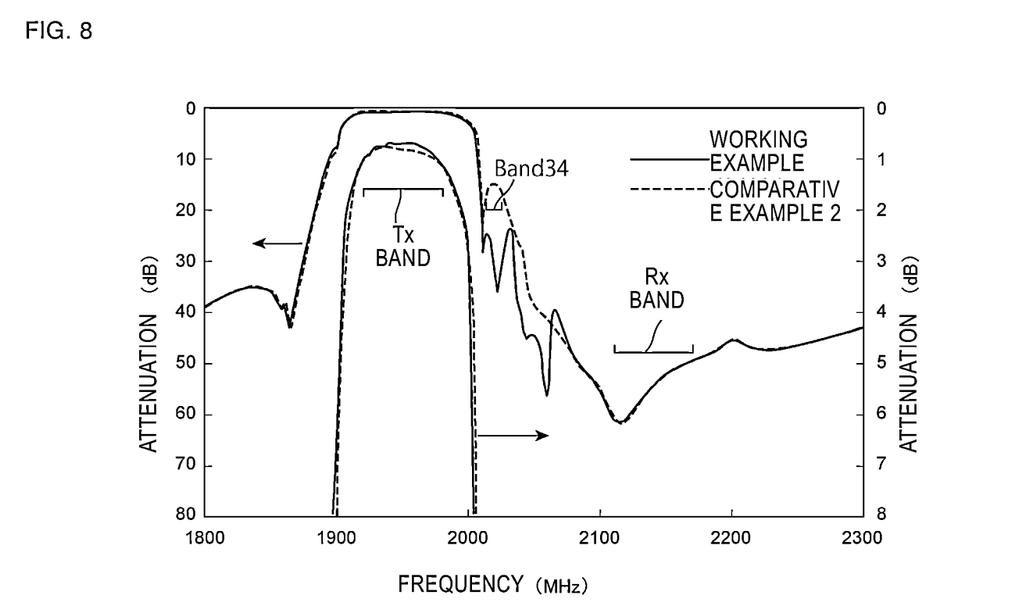
FIG. 8 is a diagram illustrating filter characteristics of filter devices of a working example and the comparative example 2.
Figure 9:
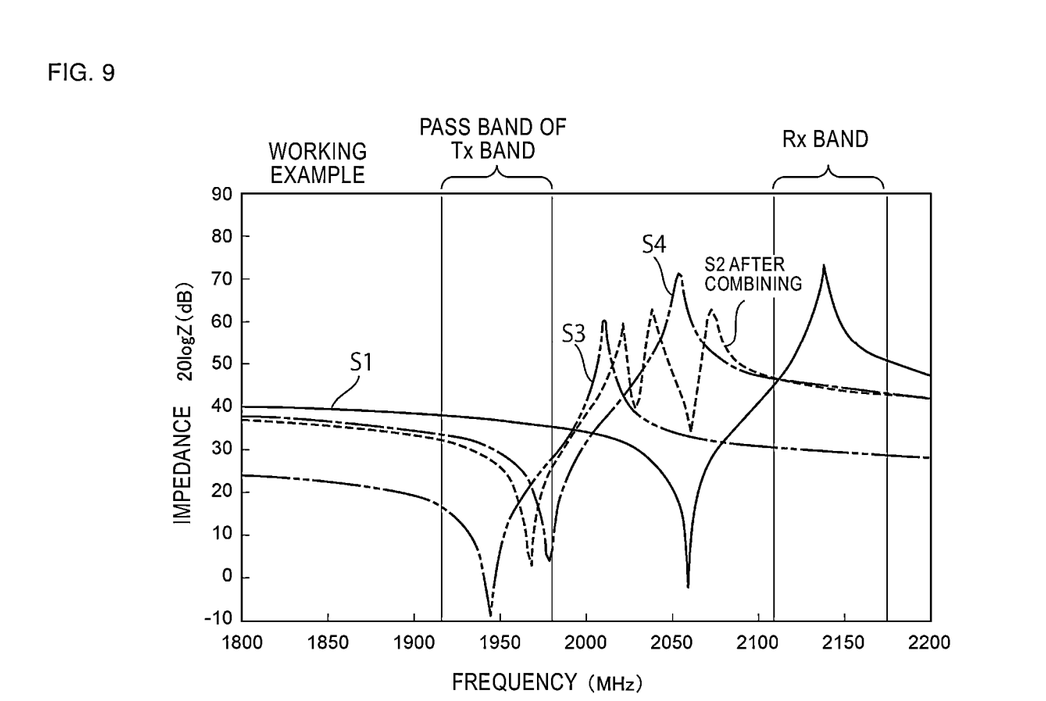
FIG. 9 is a diagram illustrating impedance characteristics of series arm resonators S1, S3, and S4 and a series arm resonator S2 including a combination of series arm resonators S2-1, S2-2, and S2-3 of the working example.
Figure 10:
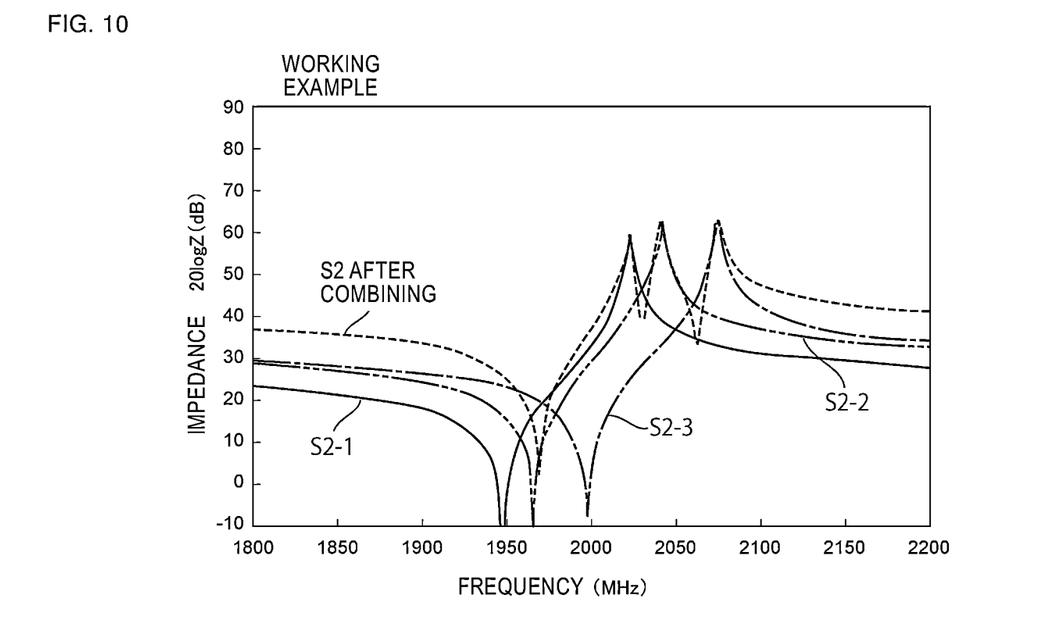
FIG. 10 is a diagram illustrating impedance characteristics of the series arm resonators S2-1, S2-2, and S2-3 and the impedance characteristic of the series arm resonator S2 after combining in the working example.

FIG. 8 is a diagram illustrating filter characteristics of the filter devices of the working example and the comparative example 2. FIG. 9 is a diagram illustrating the impedance characteristics of the series arm resonators S1, S3, and S4 and the series arm resonator S2 formed by combining the series arm resonators S2-1, S2-2, and S2-3 of the working example. FIG. 10 is a diagram illustrating the impedance characteristics of the series arm resonators S2-1, S2-2, and S2-3 of the working example and the impedance characteristic of the series arm resonator S2 after combining.

As is evident from FIG. 10, by combining the series arm resonators S2-1, S2-2, and S2-3, the number of the resonant frequencies, which is three before combining, is reduced to one after combining. The number of the anti-resonant frequencies does not change and is equal to 3 before and after combining.

In the filter device of the working example, the anti-resonant frequency of the series arm resonator S1 is positioned at about 2138 MHz as is the case with the filter device of the comparative example 2. That is to say, the anti-resonant frequency is positioned inside the reception band of Band 1. Accordingly, the attenuation of the reception band in the filter device of the working example is equivalent to the attenuation of the reception band in the filter device of the comparative example 2.

On the other hand, the attenuation in the pass band of Band 34 is about 24.5 dB in the working example. This is greater than those in the comparative examples 1 and 2 and is superior. Accordingly, the filter device of the working example can increase both the attenuation of the Rx band, that is, the reception band of Band 1 and the attenuation in the pass band of Band 34 and improve the attenuation characteristics.

Note that in the working example, because of using different electrode finger pitches in the respective series arm resonators S2-1, S2-2, and S2-3, the foregoing three anti-resonant frequencies after combining exist. In this case, of the anti-resonant frequencies of the series arm resonators S2-1, S2-2, and S2-3, the anti-resonant frequency on the lowest frequency side and the anti-resonant frequency on the highest frequency side are preferably positioned near about 2020 MHz and near 2074 MHz, respectively, in such a manner as to sandwich the resonant frequency of the series arm resonator S1, which is about 2060 MHz, for example. Because of this, the anti-resonant frequencies of the series arm resonators S2-1, S2-2, and S2-3 spread across the range from the pass band of Band 34 toward near the resonant frequency of the series arm resonator S1. Accordingly, the attenuation can be improved over a wider frequency range.

Further, compared with the filter devices of the comparative examples 1 and 2, in the filter device 1 of the working example, the loss in the transmission band of Band 1, that is, the loss in the pass band of the filter device 1 can be reduced. Specifically, while the loss is 1.14 dB in the comparative example 1 and 1.14 dB in the comparative example 2, the loss is about 1.09 dB in the working example, and thus, it becomes possible to reduce the loss. This is due to the following reasons.

In the comparative examples 1 and 2, the resonant frequency after combining of the series arm resonators S2-1, S2-2, and S2-3 is 1990 MHz and is outside the pass band of Band 1. In contrast, in the filter device 1 of the working example, the resonant frequency after combining of the series arm resonators S2-1, S2-2, and S2-3 is about 1970 MHz, for example, and is positioned inside the pass band of Band 1. That is to say, because the resonant frequency after combining is positioned inside the transmission band, the impedances of the series arm resonators S2-1, S2-2, and S2-3 decrease, and the loss decreases.

Note that by using different electrode finger pitches for the respective series arm resonators S2-1, S2-2, and S2-3, the spacing between the resonant frequency after combining and the anti-resonant frequency positioned on the highest frequency side is made wider in the working example than in the comparative examples 1 and 2. Specifically, the distance is about 104 MHz in the working example, for example, and the distance is 74 MHz in the comparative examples 1 and 2. Accordingly, the configuration of the working example is of advantage in the case where the anti-resonant frequencies after combining of the series arm resonators S2-1, S2-2, and S2-3 are positioned near the resonant frequency of the series arm resonator S1 while keeping the positions of the resonant frequencies of the series arm resonators S2-1, S2-2, and S2-3 in the inside of the transmission band. That is to say, in a pass band on the pass band's high frequency side, it becomes possible to increase the attenuation over a wide frequency range while keeping loss small.

Note that the filter device 1 is described using the example in which the filter device 1 may be applied to a transmission filter of Band 1. However, the filter devices according to example embodiments of the present invention can be used for transmission filters and reception filters of various Bands. However, in Band 1, the frequency spacing between the transmission band and reception band is about 6.36%, for example, which is a large frequency spacing.

Note that the frequency spacing [%] between the transmission band (Tx band) and the reception band (Rx band) is expressed by (Rx band lower limit frequency–Tx band upper limit frequency)/((Rx band lower limit frequency+Tx band upper limit frequency)/2)×100. In the case of Band 1, the band of Band 1 Tx=about 1920 MHz to about 1980 MHz, and the band of Band 1 Rx=about 2110 MHz to about 2170 MHz, for example. Thus, the frequency spacing between the Tx band and the Rx band=(2110−1980)/((2110+1980)/2)×100=about 6.36 [%], for example. For a transmission filter of a Band having such a large frequency spacing, a filter device according to an example embodiment of the present invention can be preferably used. That is to say, while keeping the loss small in the pass band, both the attenuation in an attenuation band near the pass band and the attenuation in the reception band, which is a counterpart band, can be improved. Particularly, in the case where a filter device according to an example embodiment of the present invention is used for a Band whose frequency spacing between the transmission band and the reception band is about 5% or more, for example, advantageous effects of the present invention become greater, and thus, the use of a filter device according to an example embodiment of the present invention in such a case is preferable.

Note that it is preferable that the resonant frequency after combining of the series arm resonators S2-1, S2-2, and S2-3, that is, the resonant frequency of the series connection configuration described above is positioned inside the pass band of the filter device 1. Because of this, as described above, the impedances of the series arm resonators S2-1, S2-2, and S2-3 in the pass band become smaller, and the loss can be reduced.

Further, it is preferable that the resonant frequency of the series arm resonator S1 is closer to the anti-resonant frequency positioned on the highest frequency side of the foregoing series connection configuration than to the anti-resonant frequency positioned on the lowest frequency side of the foregoing series connection configuration. Because of this, the resonant frequency after combining in the series connection configuration is positioned on a further lower frequency side and becomes closer to the pass band of the transmission filter. Accordingly, the impedances of the series arm resonators S2-1, S2-2, and S2-3 in the pass band become smaller, and the loss can be reduced.

Further, it is desirable that the impedance of the series arm resonator S1 is greater than the impedances of the other series arm resonators S2, S3, and S4. The impedance is proportional to the reciprocal of (the intersecting width of the electrode fingers of the interdigital transducer electrode× the number of pairs of the electrode fingers of the interdigital transducer electrode). Accordingly, in the filter device 1, the series arm resonator S1 has the largest impedance. Because of this, it becomes possible to increase the impedance near the anti-resonant frequency of the series arm resonator S1 and further increase the attenuation in the reception band. Note that it is preferable that the reciprocal of (the intersecting width of the electrode fingers×the number of pairs of the electrode fingers) of the interdigital transducer electrode in the series arm resonator S1 is greater than the reciprocals of (the intersecting width of the electrode fingers×the number of pairs of the electrode fingers) of the interdigital transducer electrodes in the other series arm resonators S2, S3, and S4. Note that the size of impedance can be compared using impedance values at a frequency that is lower than the pass band of the filter and around which the impedance varies less with the frequency (for example, a frequency of the pass band×90% or around 1800 MHz in FIG. 9).

Particularly, it is preferable that the reciprocal of (the intersecting width of the electrode fingers of the interdigital transducer electrode×the number of pairs of the electrode fingers of the interdigital transducer electrode) in the first series arm resonator is greater than the sum of the reciprocals of (the intersecting width of the electrode fingers of the interdigital transducer electrode×the number of pairs of the electrode fingers of the interdigital transducer electrode) in the respective series arm resonators that constitute the second series arm resonator.

Figure 11:
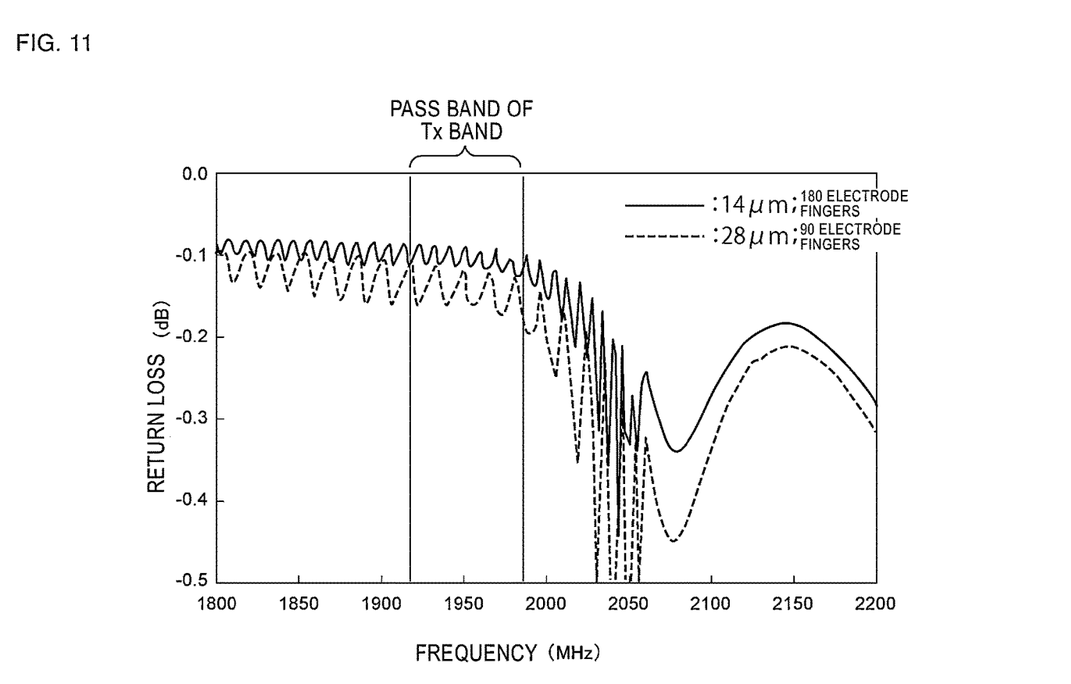
FIG. 11 is a diagram illustrating respective return loss characteristics of a first series arm resonator in the case where an intersecting width of electrode fingers of an interdigital transducer electrode is about 14 μm and about 28 μm.

FIG. 11 is a diagram illustrating the return loss characteristics of the series arm resonator S1 in the case where the intersecting width of the electrode fingers of the interdigital transducer electrode is about 14 μm and about 28 μm, for example, without changing the impedance of the series arm resonator S1. Note that in the case where the intersecting width is about 14 μm, the number of the electrode fingers of the interdigital transducer electrode is 180, and in the case where the intersecting width is about 28 μm, the number of the electrode of fingers the interdigital transducer electrode is 90.

In the case where the intersecting width is small, the resistance of the electrode fingers becomes smaller. Thus, it is preferable that the intersecting width of the interdigital transducer electrode of the series arm resonator S1 is smaller than the intersecting widths of the interdigital transducer electrodes of the other series arm resonators S2, S3, and S4. Accordingly, the return loss in the transmission band increases, and this enables the reduction of the loss caused by the series arm resonator S1. Because of this, it becomes possible to reduce the loss of the filter device 1.

Figure 12:
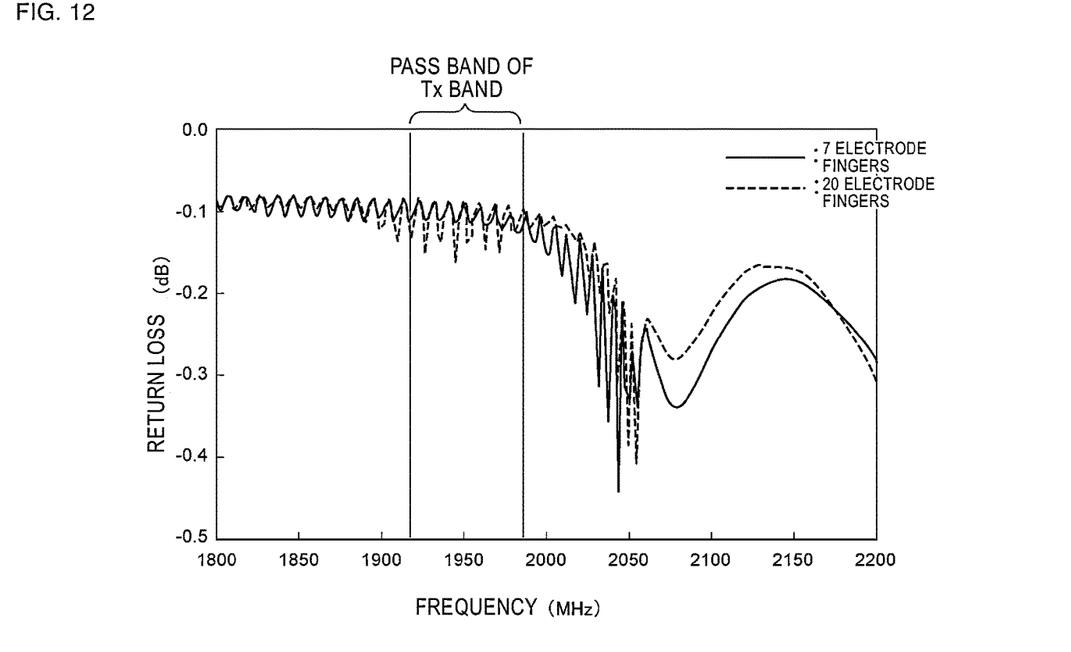
FIG. 12 is a diagram illustrating respective return loss characteristics of the first series arm resonator in the case where a number of electrode fingers of a reflector is 7 and 20.

FIG. 12 is a diagram illustrating the return loss characteristics of the first series arm resonator in the case where the number of the electrode fingers of the reflector is 7 and 20. As is evident from FIG. 12, in the case where the number of the electrode fingers in the reflector is smaller, longitudinal mode ripples generated on a lower frequency side of the resonant frequency become smaller. Accordingly, the ripples are further less likely to be generated in the transmission band. More preferably, the number of the electrode fingers of the reflector is less than 10. In that case, the longitudinal mode ripples can be reduced further.

Preferably, as in the foregoing working example, it is desirable that the number of series arm resonators in the series connection configuration is three or more, and further the number of the anti-resonant frequencies is three or more. Because of this, it becomes possible to spread the anti-resonant frequencies over a wide frequency range as described above. Accordingly, in an attenuation band on the pass band's high frequency side, it becomes possible to improve the attenuation over a wide frequency range while keeping the loss small. More preferably, in the series connection configuration, the spacing between adjacent anti-resonant frequencies is equal to or greater than about 0.5% and equal to or smaller than about 2%, for example. Because of this, the attenuation can be improved more effectively over a wider frequency range.

Note that it is desirable that the number of the electrode fingers of the reflector in the series arm resonator S1 is less than the numbers of the electrode fingers in the other series arm resonators S2, S3, and S4.

According to an example embodiment of the present invention, the resonant frequency of the first series arm resonator is between the anti-resonant frequency of the series arm resonator on the lowest frequency side of the second series arm resonator and the anti-resonant frequency of the series arm resonator on the highest frequency side of the second series arm resonator. Suppose this is a characteristic feature A. Suppose Δf (difference between the resonant frequency and the anti-resonant frequency) of resonant characteristics is the same for each of a plurality of acoustic wave resonators formed on the same piezoelectric substrate. In the case where a band pass filter whose pass band is a frequency band BW0 [%], which is determined by a certain communication standard, is realized using a ladder acoustic wave filter, empirically, it is necessary to have a filter whose target band: BWe [%] is about 2.3 times the BW0, for example. In that case, as an acoustic wave resonator, it is preferable to have a resonator having Δf of BWe/2. Note that BW0 [%]={(band upper limit frequency−band lower limit frequency)/band center frequency}×100. For example, in the case of Band 1 Tx, BW0={(1980−1920)/1950}×100=about 3.1%. Further, BWe [%]={(band upper limit frequency−band lower limit frequency)×2.3/band center frequency}× 100. For example, in the case of Band 1 Tx, BWe={(1980−1920)×2.3/1950}×100=about 7.1%. On the other hand, in the case where the electrode finger thickness and the electrode finger duty are the same, an anti-resonant frequency fa of an acoustic wave resonator is inversely proportional to an average pitch of interdigital transducer electrode fingers. That is, (fa∝1/pitch). Here, suppose the electrode finger pitch of S1: P1, of a plurality of series arm resonators (S2-1, S2-2, and S2-3) that constitute S2, the electrode finger pitch of the series arm resonator that has the largest electrode finger pitch: P2max, the electrode finger pitch of the series arm resonator that has the smallest electrode finger pitch: P2min, then, the characteristic feature A described above can be expressed as follows:

$$P2min \leq (1+0.01 \times BWe/2) \times P1 \leq P2max$$

Note that the anti-resonant frequency of the acoustic wave resonator is inversely proportional to the electrode finger thickness and also inversely proportional to the duty. That is to say, fa∝1/(pitch×electrode finger thickness×duty). Accordingly, in the case where each acoustic wave resonator has a different average pitch, a different electrode finger thickness, and a different duty, it becomes possible to replace the relationship between values of the pitch with the relationship between values of (pitch×electrode finger thickness×duty) for application.

Figure 13:
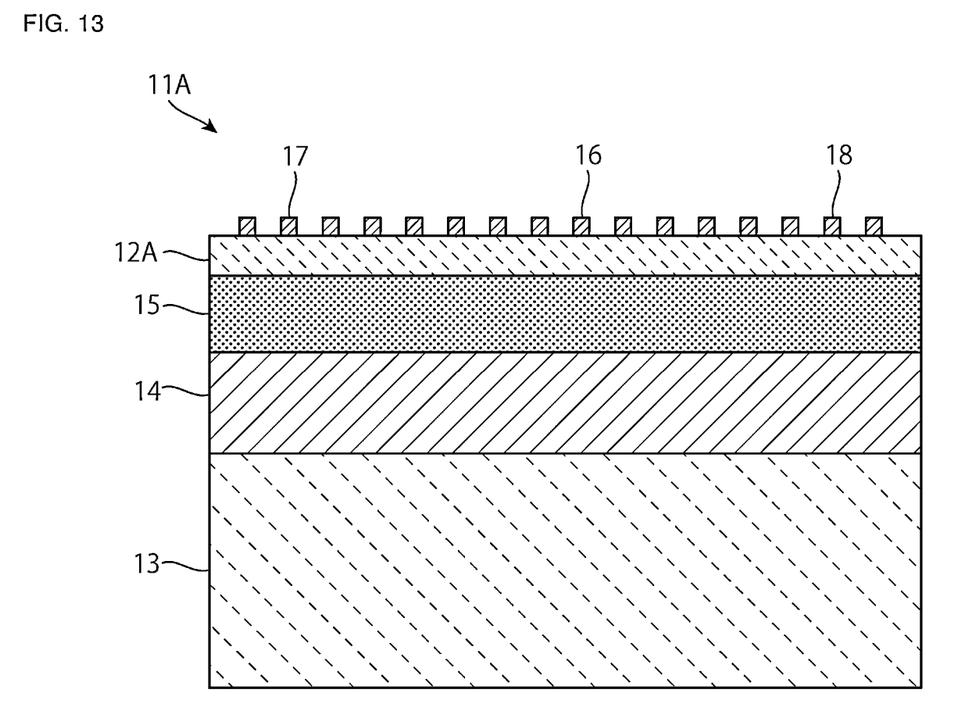
FIG. 13 is a front cross-sectional view illustrating another example of the structure of an acoustic wave resonator included in a filter device of an example embodiment of the present invention.

FIG. 13 is a front cross-sectional view illustrating another example of a structure of an acoustic wave resonator included in a filter device according to an example embodiment of the present invention. An acoustic wave resonator 11A includes a support substrate 13. The support substrate 13 includes Si. However, the support substrate 13 can be configured using an appropriate insulator or semiconductor. On the support substrate 13, a high acoustic velocity member 14, a low acoustic velocity film 15, and a piezoelectric layer 12A are stacked on top of each other in this order. The piezoelectric layer 12A includes a piezoelectric single crystal. In the present example embodiment, LiTaO₃ is used. However, other piezoelectric single crystal such as LiNbO₃ or the like may alternatively be used. On the piezoelectric layer 12A, the interdigital transducer electrode 16 and the reflectors 17 and 18 are provided.

The high acoustic velocity member 14 includes a high acoustic velocity material. When an acoustic velocity of a bulk wave propagating through a material is higher than an acoustic velocity of an acoustic wave propagating through the piezoelectric layer 12A, this material is referred to as a high acoustic velocity material. As the high acoustic velocity material described above, various materials such as aluminum oxide, silicon carbide, silicon nitride, silicon oxynitride, silicon, sapphire, lithium tantalate, lithium niobate, crystal, alumina, zirconia, cordierite, mullite, steatite, forsterite, magnesia, a DLC (diamond like carbon) film, or diamond, a medium whose main component is the foregoing material, a medium whose main component is a mixture of the foregoing materials, or the like can be used. In the present example embodiment, the high acoustic velocity member 14 includes silicon nitride.

The low acoustic velocity film 15 includes a low acoustic velocity material. When an acoustic velocity of a bulk wave propagating through a material is lower than an acoustic velocity of a bulk wave propagating through the piezoelectric layer 12A, this material is referred to as a low acoustic velocity material. As the low acoustic velocity material described above, various materials such as silicon oxide, glass, silicon oxynitride, or tantalum oxide, a compound prepared by adding fluorine, carbon, boron, or hydrogen, or a silanol group to silicon oxide, a medium whose main component is the foregoing material, and the like can be used. In the present example embodiment, the low acoustic velocity film 15 includes silicon oxide.

Note that in the acoustic wave resonator 11A illustrated in FIG. 13, the high acoustic velocity member 14 and the low acoustic velocity film 15 are stacked on top of each other. Alternatively, a structure in which the support substrate 13 and the high acoustic velocity member 14 are unified using a high acoustic velocity material may be used. That is to say, the acoustic wave resonator 11A may have a structure in which the low acoustic velocity film 15 is stacked between a support substrate including the high acoustic velocity material and the piezoelectric layer 12A. Further, the low acoustic velocity film 15 may be omitted. That is to say, the high acoustic velocity member 14 may be stacked directly on the piezoelectric layer 12A, or the piezoelectric layer 12A may be stacked directly on the support substrate including the high acoustic velocity material described above.

Further, in the foregoing example embodiment, each of the series arm resonators S1, S2-1, S2-2, S2-3, S3, and S4 and the parallel arm resonators P1 to P3 is configured using a surface acoustic wave resonator but may alternatively be configured using a BAW resonator.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a plurality of series arm resonators; and
at least one parallel arm resonator; wherein
the plurality of series arm resonators includes at least one first series arm resonator and at least one second series arm resonator, the at least one second series arm resonator being different from the at least one first series arm resonator;
a resonant frequency of the at least one first series arm resonator is higher than a pass band of the filter device;
the at least one second series arm resonator has a series connection configuration in which at least two series arm resonators are connected in series to one another;
anti-resonant frequencies of the at least two series arm resonators are different from one another; and
the resonant frequency of the at least one first series arm resonator is between an anti-resonant frequency of the series arm resonator on a lowest frequency side of the second series arm resonator and an anti-resonant frequency of the series arm resonator on a highest frequency side of the second series arm resonator.

2. The filter device according to claim 1, wherein resonant frequencies of the at least two series arm resonators of the series connection configuration are inside the pass band of the filter device.

3. The filter device according to claim 1, wherein the resonant frequency of the first series arm resonator is closer to a highest anti-resonant frequency of the series connection configuration than to a lowest anti-resonant frequency of the series connection configuration.

4. The filter device according to claim 1, wherein an impedance of the at least one first series arm resonator is greater than an impedance of the at least one second series arm resonator.

5. The filter device according to claim 1, wherein
a reciprocal of an intersecting width of electrode fingers of an interdigital transducer electrode×a number of pairs of electrode fingers of the interdigital transducer electrode in the at least one first series arm resonator is greater than a sum of reciprocals of an intersecting width of electrode fingers of an interdigital transducer electrode×a number of pairs of electrode fingers of the interdigital transducer electrode in respective series arm resonators of the at least one second series arm resonator.

6. The filter device according to claim 1, wherein an intersecting width of an interdigital transducer electrode of the at least one first series arm resonator is smaller than an intersecting width of an interdigital transducer electrode of the at least one second series arm resonator.

7. The filter device according to claim 1, wherein
each of the first and second series arm resonators includes an interdigital transducer electrode and reflectors on two sides of the interdigital transducer electrode in an acoustic wave propagation direction; and
a number of electrode fingers in the reflector of the at least one first series arm resonator is less than a number of electrode fingers in the reflector of the at least one second series arm resonator.

8. The filter device according to claim 1, wherein the at least one second series arm resonator includes at least three series arm resonators that are connected in series to one another and has at least three anti-resonant frequencies.

9. A multiplexer comprising:
the filter device according to claim 1; and
at least one other filter device including an end portion defining a common connection with an end portion of the filter device.

10. A filter device comprising:
a piezoelectric substrate and a plurality of acoustic wave resonators on the piezoelectric substrate; wherein
the plurality of acoustic wave resonators includes a plurality of series arm resonators and at least one parallel arm resonator;
the plurality of series arm resonators includes at least one first series arm resonator and at least one second series arm resonator, the at least one second series arm resonator being different from the at least one first series arm resonator;
a resonant frequency of the at least one first series arm resonator is higher in frequency than a pass band of the filter device;
the at least one second series arm resonator has a series connection configuration in which at least two series arm resonators are connected in series to one another; and
when, in the at least two series arm resonators, an electrode finger pitch of the series arm resonator with a largest electrode finger pitch is expressed as P2max, an electrode finger pitch of the series arm resonator with a smallest electrode finger pitch is expressed as P2min, and an electrode finger pitch of the at least one first series arm resonator is expressed as P1, a following relationship is satisfied:

$P2min \leq (1+0.01 \times BWe/2) \times P1 \leq P2max$ where $BWe = \{$(a filter device pass band upper limit frequency−a filter device pass band lower limit frequency)×2.3/a pass band center frequency$\} \times 100[\%]$.

11. The filter device according to claim 10, wherein resonant frequencies of the at least two series arm resonators of the series connection configuration are inside the pass band of the filter device.

12. The filter device according to claim 10, wherein the resonant frequency of the first series arm resonator is closer to a highest anti-resonant frequency of the series connection configuration than to a lowest anti-resonant frequency of the series connection configuration.

13. The filter device according to claim 10, wherein an impedance of the at least one first series arm resonator is greater than an impedance of the at least one second series arm resonator.

14. The filter device according to claim 10, wherein
a reciprocal of an intersecting width of electrode fingers of an interdigital transducer electrode×a number of pairs of electrode fingers of the interdigital transducer electrode in the at least one first series arm resonator is greater than a sum of reciprocals of an intersecting width of electrode fingers of an interdigital transducer electrode×a number of pairs of electrode fingers of the interdigital transducer electrode in respective series arm resonators of the at least one second series arm resonator.

15. The filter device according to claim 10, wherein an intersecting width of an interdigital transducer electrode of the at least one first series arm resonator is smaller than an intersecting width of an interdigital transducer electrode of the at least one second series arm resonator.

16. The filter device according to claim 10, wherein
each of the first and second series arm resonators includes an interdigital transducer electrode and reflectors on two sides of the interdigital transducer electrode in an acoustic wave propagation direction; and
a number of electrode fingers in the reflector of the at least one first series arm resonator is less than a number of electrode fingers in the reflector of the at least one second series arm resonator.

17. The filter device according to claim 10, wherein the at least one second series arm resonator includes at least three series arm resonators that are connected in series to one another and has at least three anti-resonant frequencies.

18. A multiplexer comprising:
the filter device according to claim 10; and
at least one other filter device including an end portion defining a common connection with an end portion of the filter device.

* * * * *